US010629492B2

(12) United States Patent
Lin et al.

(10) Patent No.: US 10,629,492 B2
(45) Date of Patent: Apr. 21, 2020

(54) GATE STRUCTURE HAVING A DIELECTRIC GATE AND METHODS THEREOF

(71) Applicant: Taiwan Semiconductor Manufacturing Co., Ltd., Hsin-Chu (TW)

(72) Inventors: Ta-Chun Lin, Hsinchu (TW); Buo-Chin Hsu, Hsinchu (TW); Kuo-Hua Pan, Hsinchu (TW); Jhon Jhy Liaw, Hsinchu County (TW); Chih-Yung Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/964,177

(22) Filed: Apr. 27, 2018

(65) Prior Publication Data

US 2019/0333822 A1 Oct. 31, 2019

(51) Int. Cl.
*H01L 21/8234* (2006.01)
*H01L 27/088* (2006.01)
*H01L 29/06* (2006.01)
*H01L 21/311* (2006.01)
*H01L 29/66* (2006.01)
*H01L 21/3105* (2006.01)

(52) U.S. Cl.
CPC ........ *H01L 21/823462* (2013.01); *H01L 21/31051* (2013.01); *H01L 21/31105* (2013.01); *H01L 21/823431* (2013.01); *H01L 27/0886* (2013.01); *H01L 29/0649* (2013.01); *H01L 29/66545* (2013.01)

(58) Field of Classification Search
CPC ..... H01L 21/823462; H01L 21/823431; H01L 21/31051; H01L 29/66545; H01L 29/0649; H01L 27/0886; H01L 21/31105
USPC ......................................................... 257/401
See application file for complete search history.

(56) References Cited

U.S. PATENT DOCUMENTS

| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 9,601,567 | B1 * | 3/2017 | Hsieh ............... H01L 29/785 |
| 9,899,397 | B1 * | 2/2018 | Leobandung ..... H01L 21/28273 |

(Continued)

*Primary Examiner* — Mohammad M Hoque
(74) *Attorney, Agent, or Firm* — Haynes and Boone, LLP

(57) ABSTRACT

A semiconductor structure includes a fin active region extruded from a semiconductor substrate; and a gate stack disposed on the fin active region. The gate stack includes a gate dielectric layer and a gate electrode disposed on the gate dielectric layer. The gate dielectric layer includes a first dielectric material. The semiconductor structure further includes a dielectric gate of a second dielectric material disposed on the fin active region. The gate dielectric layer extends from a sidewall of the gate electrode to a sidewall of the dielectric gate. The second dielectric material is different from the first dielectric material in composition.

20 Claims, 16 Drawing Sheets

(56) References Cited

U.S. PATENT DOCUMENTS

| | | | |
|---|---|---|---|
| 9,929,048 B1* | 3/2018 | Xie | H01L 21/76897 |
| 9,929,157 B1* | 3/2018 | Xie | H01L 27/0886 |
| 10,083,874 B1* | 9/2018 | Yu | H01L 21/823437 |
| 10,176,995 B1* | 1/2019 | Wu | H01L 21/845 |
| 2015/0236106 A1* | 8/2015 | Zaleski | H01L 29/41758 |
| | | | 257/383 |
| 2016/0133632 A1* | 5/2016 | Park | H01L 21/823828 |
| | | | 257/369 |
| 2016/0172378 A1* | 6/2016 | Chou | H01L 27/1211 |
| | | | 257/347 |
| 2017/0018620 A1* | 1/2017 | Liu | H01L 29/4238 |
| 2017/0148682 A1* | 5/2017 | Basker | H01L 21/823431 |
| 2017/0186746 A1* | 6/2017 | Chung | H01L 29/785 |
| 2017/0317079 A1* | 11/2017 | Kim | H01L 21/30604 |
| 2018/0069000 A1* | 3/2018 | Bergendahl | H01L 27/0886 |
| 2018/0138092 A1* | 5/2018 | Lee | H01L 21/823462 |
| 2018/0182859 A1* | 6/2018 | Lee | H01L 29/4958 |
| 2018/0261514 A1* | 9/2018 | Xie | H01L 29/66545 |
| 2018/0261596 A1* | 9/2018 | Jun | H01L 29/0646 |
| 2018/0277652 A1* | 9/2018 | Park | H01L 29/785 |
| 2019/0051526 A1* | 2/2019 | Khang | H01L 29/7854 |
| 2019/0067115 A1* | 2/2019 | Park | H01L 21/823437 |
| 2019/0067277 A1* | 2/2019 | Tsai | H01L 27/0886 |
| 2019/0067417 A1* | 2/2019 | Ching | H01L 29/0653 |
| 2019/0131428 A1* | 5/2019 | Huang | H01L 29/66545 |
| 2019/0139759 A1* | 5/2019 | Cheng | H01L 21/02321 |
| 2019/0139830 A1* | 5/2019 | Xie | H01L 21/823481 |
| 2019/0139957 A1* | 5/2019 | Liao | H01L 21/823821 |
| 2019/0148373 A1* | 5/2019 | Shi | H01L 21/31144 |
| | | | 257/401 |
| 2019/0157387 A1* | 5/2019 | Wu | H01L 21/02337 |
| 2019/0189782 A1* | 6/2019 | Greene | H01L 21/823431 |
| 2019/0206980 A1* | 7/2019 | Jan | H01L 28/24 |

* cited by examiner

GATE STRUCTURE HAVING A DIELECTRIC GATE AND METHODS THEREOF

BACKGROUND

An integrated circuit is formed on a semiconductor substrate and includes various devices, such as transistors, diodes, and/or resistors, configured and connected together to a functional circuit. Especially, the integrated circuit further includes field-effect transistors, such as metal-oxide-semiconductor FETs (MOSFETs) or complimentary MOSFETs, wherein each includes a gate electrode to control the channel region of the corresponding FET. When a semiconductor device such as a MOSFET is scaled down through various technology nodes, high k dielectric material and metal are adopted to form a gate stack. However, in a method to form metal gate stacks for n-type MOS (nMOS) transistors and p-type MOS (pMOS) transistors, various issues may arise when integrating the processes and materials for this purpose. For example, when a metal gate is formed through gate replacement, there is insufficient line-end process window since the gate dielectric layer is also formed on the sidewalls, leaving less opening to fill in with the metal or metal alloy. Furthermore, the profile of the metal gate stack is dependent on the layout of the gate-cut feature and the dielectric gate. This affects the threshold voltage and saturation current, and causes the variation of the device performance. Therefore, it is therefore desired to have a new device structure and the method making the same to address the above concerns with enhanced circuit performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
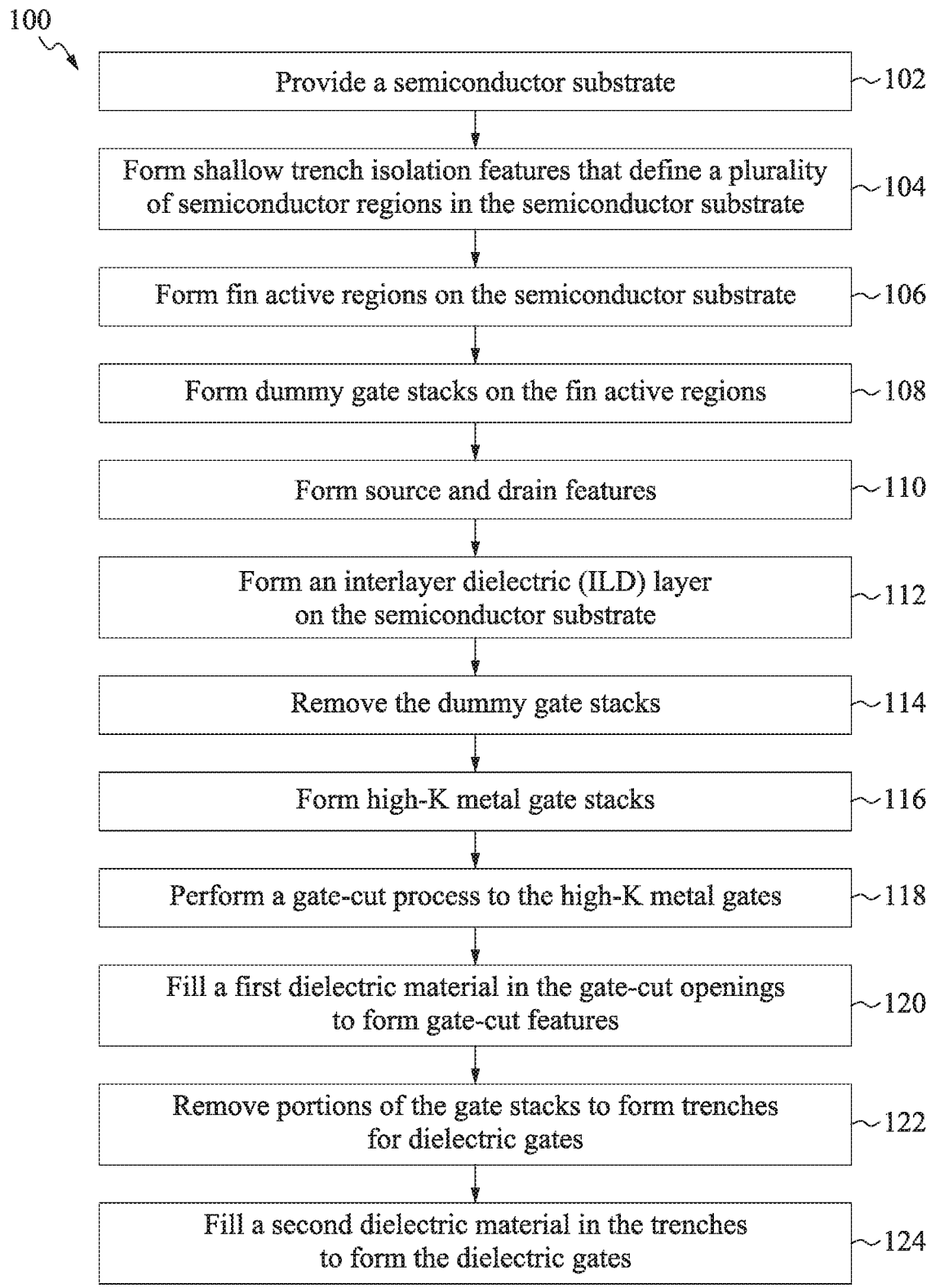
FIG. 1 is a flowchart of a method making a semiconductor structure having a multi-fin structure constructed according to various aspects of the present disclosure in some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure provides various embodiments of a semiconductor structure formed on a semiconductor substrate. The semiconductor structure includes various devices, such as field-effect transistors (FETs) having metal gate stacks with the gate dielectric layer of a high-k dielectric material and the gate electrode of metal or metal alloy. The semiconductor structure further includes dielectric gates and gate-cut features integrated with the metal gate stacks. The semiconductor structure is formed by the disclosed method with enhanced process window and improved device performance.

FIG. 1 is a flowchart of a method 100 for fabricating a semiconductor structure having fin-type transistors and metal gate stacks constructed according to some embodiments. FIGS. 2 through 17 are top or sectional views of a semiconductor structure 200 at various fabrication stages.

The semiconductor structure 200 and the method 100 making the same are collectively described below with reference to FIGS. 1 through 17.

Figure 2:
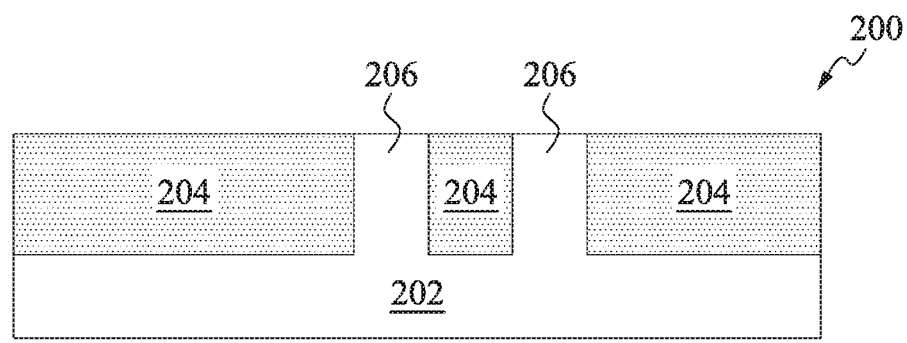
FIG. 2 is a sectional view of a semiconductor structure at a fabrication stage constructed according to some embodiments.

Referring to FIG. 2, the method 100 begins with block 102 by providing a semiconductor substrate 202. The semiconductor substrate 202 includes silicon. In some other embodiments, the substrate 202 includes germanium, silicon germanium or other proper semiconductor materials. The substrate 202 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The semiconductor substrate 202 also includes various doped regions such as n-well and p-wells. In one embodiment, the semiconductor substrate 202 includes an epitaxy (or epi) semiconductor layer. In another embodiment, the semiconductor substrate 202 includes a buried dielectric material layer for isolation formed by a proper technology, such as a technology referred to as separation by implanted oxygen (SIMOX). In some embodiments, the substrate 202 may be a semiconductor on insulator, such as silicon on insulator (SOI).

Still referring to FIG. 2, the method 100 proceeds to an operation 104 by forming shallow trench isolation (STI) features 204 on the semiconductor substrate 202. In some embodiments, the STI features 204 are formed etching to form trenches, filling the trenches with dielectric material and polishing to remove the excessive dielectric material and planarize the top surface. One or more etching processes are performed on the semiconductor substrate 202 through openings of soft mask or hard mask, which are formed by lithography patterning and etching. The formation of the STI features 204 are further described below in accordance with some embodiments.

In the present example, a hard mask is deposited on the substrate 202 and is patterned by lithography process. The hard mask layers include a dielectric such as semiconductor oxide, semiconductor nitride, semiconductor oxynitride, and/or semiconductor carbide, and in an exemplary embodiment, the hard mask layer include a silicon oxide film and a silicon nitride film. The hard mask layer may be formed by thermal growth, atomic layer deposition (ALD), chemical vapor deposition (CVD), high density plasma CVD (HDP-CVD), other suitable deposition processes.

A photoresist layer (or resist) used to define the fin structure may be formed on the hard mask layer. An exemplary resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is also referred to as lithographic patterning.

In one embodiment, the resist layer is patterned to leave the portions of the photoresist material disposed over the semiconductor structure 200 by the lithography process. After patterning the resist, an etching process is performed on the semiconductor structure 200 to open the hard mask layer, thereby transferring the pattern from the resist layer to the hard mask layer. The remaining resist layer may be removed after the patterning the hard mask layer. An exemplary lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the hard mask layer may include wet etching, dry etching or a combination thereof. The etching process may include multiple etching steps. For example, the silicon oxide film in the hard mask layer may be etched by a diluted hydrofluorine solution and the silicon nitride film in the hard mask layer may be etched by a phosphoric acid solution.

Then etching process is followed to etch the portions of the substrate 102 not covered by the patterned hard mask layer. The patterned hard mask layer is used as an etch mask during the etching processes to pattern the substrate 202. The etching processes may include any suitable etching technique such as dry etching, wet etching, and/or other etching methods (e.g., reactive ion etching (RIE)). In some embodiments, the etching process includes multiple etching steps with different etching chemistries, designed to etching the substrate to form the trenches with particular trench profile for improved device performance and pattern density. In some examples, the semiconductor material of the substrate may be etched by a dry etching process using a fluorine-based etchant. Particularly, the etching process applied to the substrate is controlled such that the substrate 202 is partially etched. This may be achieved by controlling etching time or by controlling other etching parameter(s). After the etching processes, the active regions 206 are defined on the substrate 102.

One or more dielectric material is filled in the trenches to form the STI feature 204. Suitable fill dielectric materials include semiconductor oxides, semiconductor nitrides, semiconductor oxynitrides, fluorinated silica glass (FSG), low-K dielectric materials, and/or combinations thereof. In various exemplary embodiments, the dielectric material is deposited using a HDP-CVD process, a sub-atmospheric CVD (SACVD) process, a high-aspect ratio process (HARP), a flowable CVD (FCVD), and/or a spin-on process.

The deposition of the dielectric material may be followed by a chemical mechanical polishing/planarization (CMP) process to remove the excessive dielectric material and planarize the top surface of the semiconductor structure. The CMP process may use the hard mask layers as a polishing stop layer to prevent polishing the semiconductor layer 202. In this case, the CMP process completely removes the hard mask. The hard mask may be removed alternatively by an etching process. Although in further embodiments, some portion of the hard mask layers remain after the CMP process.

Figure 3A:
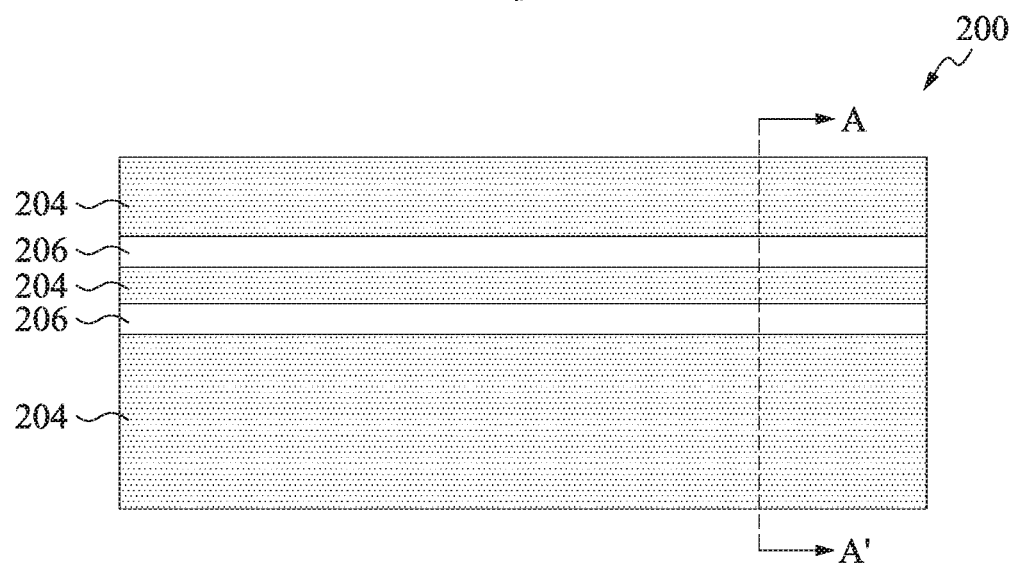
FIG. 3A is a top view of the semiconductor structure of FIG. 2 at a subsequent fabrication stage constructed according to some embodiments.
Figure 3B:
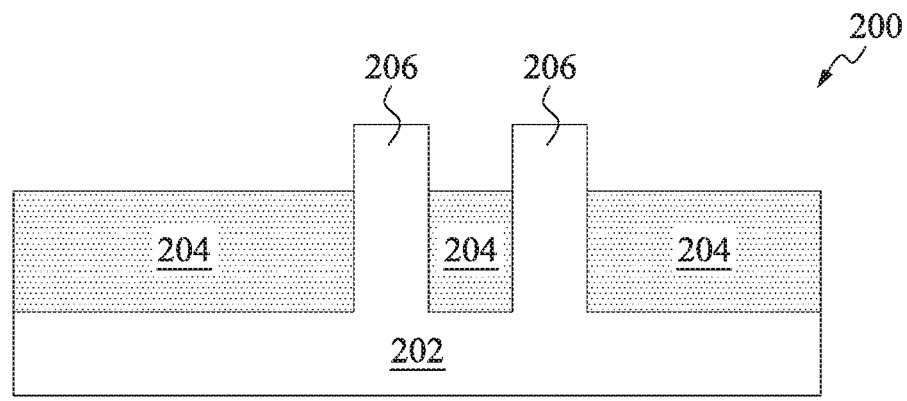
FIG. 3B is a sectional view of the semiconductor structure of FIG. 3A along the dashed line AA', constructed according to some embodiments.

Referring to FIGS. 3A and 3B, the method 100 proceeds to an operation 106 by forming the fin structure 206 having multiple fin active regions (or fin features). FIG. 3A and FIG. 3B are a top view and a sectional view along the dashed line AA' of the semiconductor structure 200, respectively. The operation 106 includes recessing the STI features 204 such that the fin active regions 206 are extruded above from the STI features 204. The recessing process employs one or more etching steps (such as dry etch, wet etch or a combination thereof) to selectively etch back the STI features 204. For example, a wet etching process using hydrofluoric acid may be used to etch when the STI features 204 are silicon oxide. Exemplary fin active regions 206 are spaced from each in a first direction (X direction). The fin active regions 206 have elongated shape and oriented along a second direction (Y direction), which is orthogonal with the X direction. In alternative embodiments, the fin active regions 206 are formed by epitaxial growth with one or more semiconductor material, such as silicon and silicon germanium. In other embodiments, the fin active regions 206 are formed by a combination of etching to recess the STI features 204 and epitaxially growing the semiconductor material selectively on the active regions.

Various doping processes may be applied to the semiconductor regions to form various doped wells, such as n-wells and p-wells at the present stage or before the operation 106. Various doped wells may be formed in the semiconductor substrate by respective ion implantations.

Figure 4A:
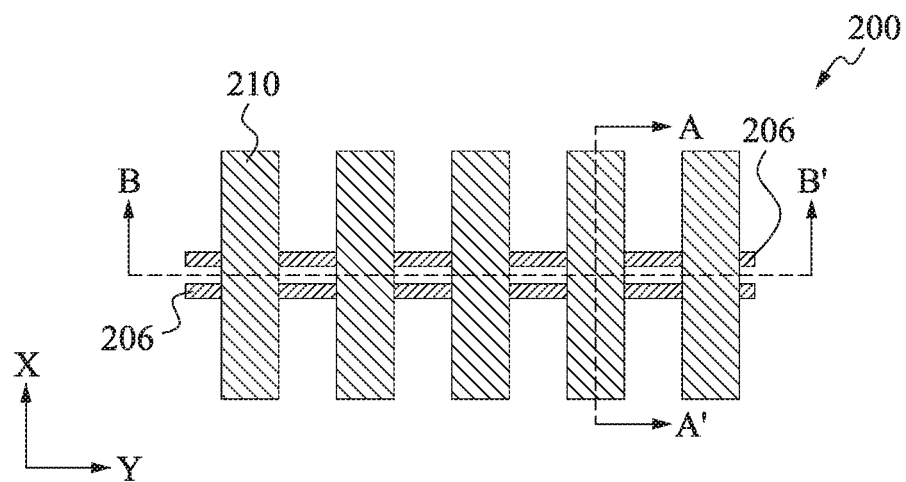
FIGS. 4A, 5A, 6A, 7A, 8A, 9A, 10A, and 11A are top views of the semiconductor structure at various fabrication stages constructed according to some embodiments.
Figure 4B:
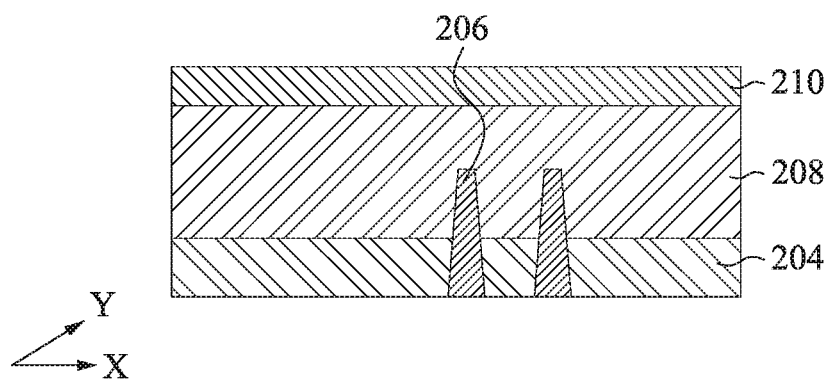
FIGS. 4B, 5B, 6B, 7B, 8B, 9B, 10B, and 11B are sectional views of the semiconductor structure along the dashed line AA' at respective fabrication stages constructed according to some embodiments.
Figure 4C:
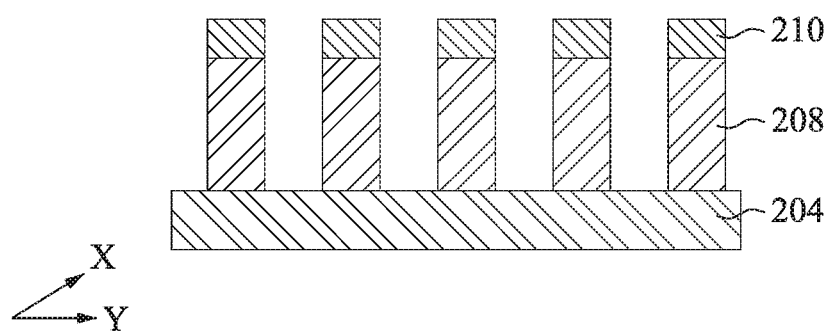
FIGS. 4C, 5C, 6C, 7C, 8C, 9C, 10C, and 11C are sectional views of the semiconductor structure along the dashed line BB' at respective fabrication stages constructed according to some embodiments.

Referring to FIGS. 4A, 4B and 4C, the method 100 proceeds to an operation 108 by forming dummy gate stacks 208 on the fin active regions 206. FIG. 4A is a top view; FIG. 4B is a sectional view along the dashed line AA'; and FIG. 4C is a sectional view along the dashed line BB' of the semiconductor structure 200, in portion, constructed in accordance with some embodiments. Some features are skipped for simplicity. For examples, the substrate 102 is not shown in FIGS. 4A-4C; and the STI features 204 are not shown in FIG. 1A. In the present embodiment, the gate stacks 208 include five exemplary gate stacks as illustrated in FIG. 4C. The dummy gate stacks 208 have elongated shapes and are oriented in the X direction. Each of the dummy gate stacks 208 is disposed over one or more fin active regions 206.

The dummy gate stacks 208 may each include a gate dielectric layer and a gate electrode over the gate dielectric layer. The gate dielectric layer includes a dielectric material, such as silicon oxide and the gate electrode includes a conductive material, such as polysilicon. The formation of the dummy gate stacks 208 includes depositing the gate materials (including forming silicon oxide and polysilicon in the present example); and patterning the gate materials by a lithographic process and etching. A hard mask layer 210 may be formed on the gate materials and is used as an etch mask during the formation of the dummy gate stacks. The hard mask layer 210 may include any suitable material, such as a silicon oxide, a silicon nitride, a silicon carbide, a silicon oxynitride, other suitable materials, and/or combinations thereof. In one embodiment, the hard mask layer 210 includes multiple films, such as silicon oxide and silicon nitride. In some embodiments, the patterning process to form the gate stacks includes forming a patterned resist layer by lithography process; etching the hard mask layer using the patterned resist layer as an etch mask; and etching the gate materials to form the gate stacks 208 using the patterned hard mask layer as an etch mask.

One or more gate spacers (not shown) are formed on the sidewalls of the dummy gate stacks 208. The gate spacers may be used to offset the subsequently formed source/drain features and may be used for designing or modifying the source/drain structure profile. The gate spacers may include any suitable dielectric material, such as a semiconductor oxide, a semiconductor nitride, a semiconductor carbide, a semiconductor oxynitride, other suitable dielectric materials, and/or combinations thereof. The gate spacers 210 may have multiple films, such as two films (a silicon oxide film and a silicon nitride film) or three films ((a silicon oxide film; a silicon nitride film; and a silicon oxide film). The formation of the gate spacers includes deposition and anisotropic etching, such as dry etching.

The dummy gate stacks 208 are configured on the fin active regions for various field effect transistors (FETs), therefore also referred to as FinFETs. Those dummy gate stacks 208 are to be replaced by metal gates at later fabrication stages. The field effect transistors include n-type transistors and p-type transistors integrated together. In some examples, those field effect transistors are configured to form logic gate, such as NOR logic gate, NAND logic gate; memory devices, such as one or more static random access memory (SRAM) cells; other devices, such as I/O devices; or a combination thereof.

The method 100 may proceed to an operation 110 by forming various source and drain (not shown) to respective FinFETs. The source and drain may include both light doped drain (LDD) features and heavily doped source and drain (S/D). For example, each field effect transistor includes source and drain formed on the respective fin active region and interposed by the corresponding dummy gate stack 208. A channel is formed in the fin active region in a portion that is underlying the corresponding gate stack and spans between the source and drain.

The raised source/drain may be formed by selective epitaxy growth for strain effect with enhanced carrier mobility and device performance. The dummy gate stacks 208 and the gate spacer constrain the source/drain to the source/drain regions. In some embodiments, the source/drain are formed by one or more epitaxy processes, whereby Si features, SiGe features, SiC features, and/or other suitable features are grown in crystalline state on the fin active regions 206. Alternatively, an etching process is applied to recess the source/drain regions before the epitaxy growth. Suitable epitaxy processes include CVD deposition techniques (e.g., vapor-phase epitaxy (VPE) and/or ultra-high vacuum CVD (UHV-CVD), molecular beam epitaxy, and/or other suitable processes. The epitaxy process may use gaseous and/or liquid precursors, which interact with the composition of the fin active regions 206.

The source and drain may be in-situ doped during the epitaxy process by introducing doping species including: p-type dopants, such as boron or $BF_2$; n-type dopants, such as phosphorus or arsenic; and/or other suitable dopants including combinations thereof. If the source and drain are not in-situ doped, an implantation process (i.e., a junction implant process) is performed to introduce the corresponding dopant into the source and drain. In an exemplary embodiment, the source and drain in an nFET include SiC or Si doped with phosphorous, while those in a pFET include Ge or SiGe doped with boron. In some other embodiments, the raised source and drain include more than one semiconductor material layers. For example, a silicon germanium layer is epitatially grown on the substrate within the source and drain regions and a silicon layer is epitaxially grown on the silicon germanium layer. One or more annealing processes may be performed thereafter to activate the source and drain. Suitable annealing processes include rapid thermal annealing (RTA), laser annealing processes, other suitable annealing technique or a combination thereof.

Figure 5A:
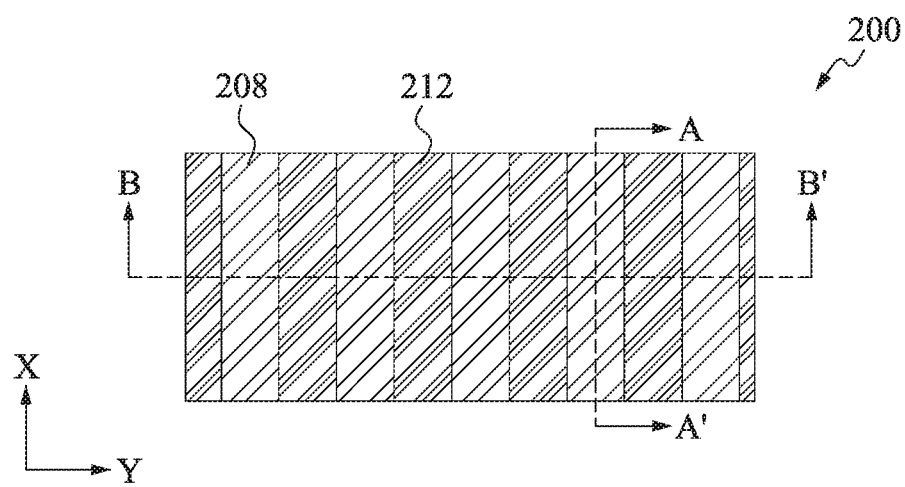
Figure 5B:
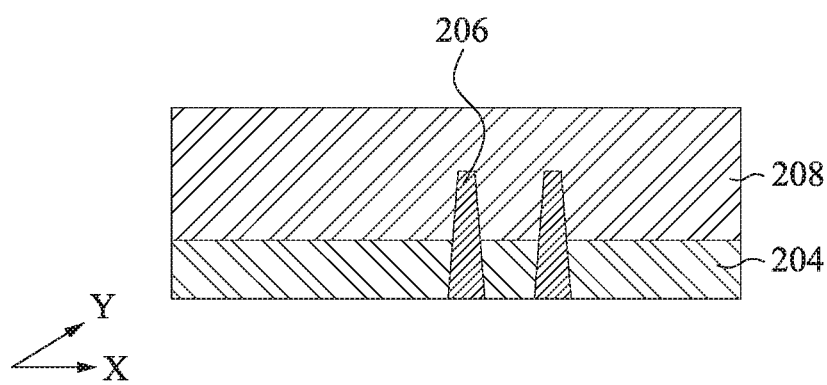
Figure 5C:
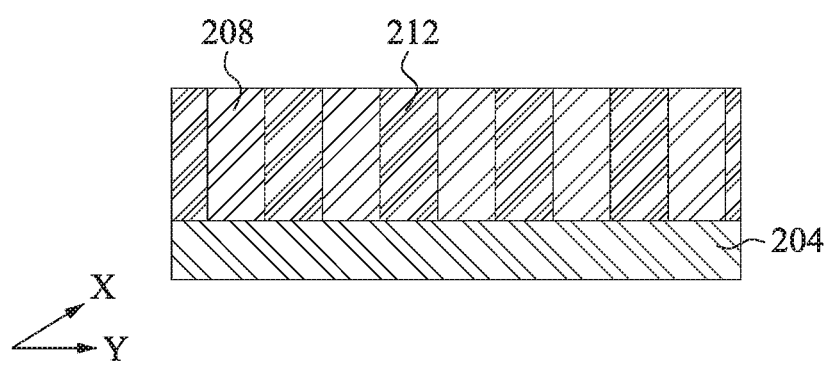

Referring to FIGS. 5A, 5B and 5C, the method 100 proceeds to an operation 112 by forming an inter-layer dielectric layer 212 on the fin active regions 206 and the dummy gate stacks 208. FIG. 5A is a top view; FIG. 5B is a sectional view along the dashed line AA'; and FIG. 5C is a sectional view along the dashed line BB' of the semiconductor structure 200, in portion, constructed in accordance with some embodiments.

The ILD 212 surround the dummy gate stacks 208 allowing the dummy gate stacks 208 to be removed and replacement gates to be formed in the resulting cavity (also referred to as gate trench). The ILD layer 212 may also be part of an electrical interconnect structure that electrically interconnects various devices of the semiconductor structure 200. In such embodiments, the ILD layer 212 acts as an insulator that supports and isolates the conductive traces. The ILD layer 212 may include any suitable dielectric material, such as a semiconductor oxide, a semiconductor nitride, a semiconductor oxynitride, other suitable dielectric materials, or combinations thereof. In some embodiments, the formation of the ILD layer 212 includes deposition and CMP to provide a planarized top surface. The hard mask 210 may be removed at this stage, such as by the CMP or an additional etching process.

Figure 6A:
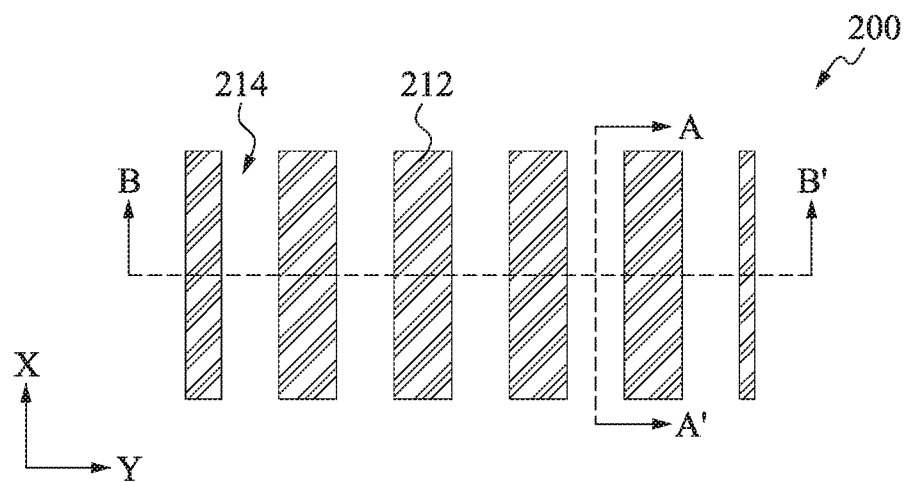
Figure 6B:
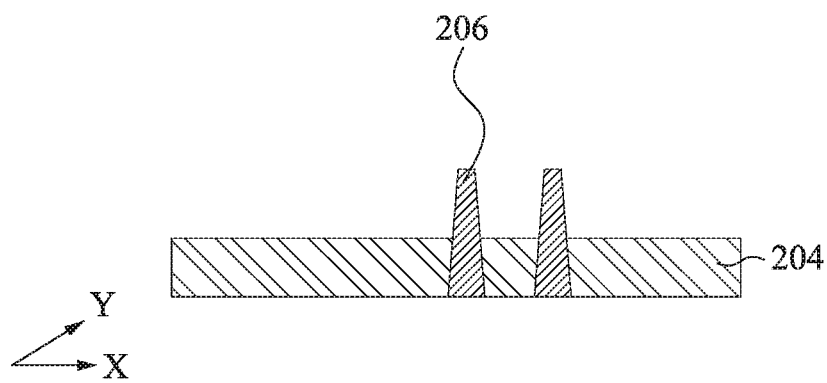
Figure 6C:
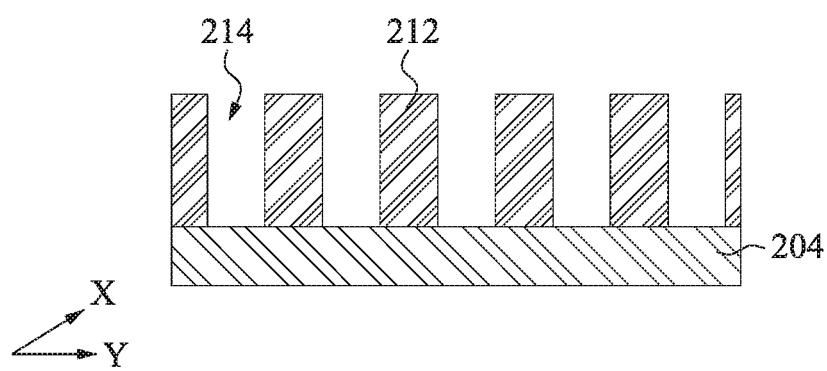

Referring to FIGS. 6A, 6B and 6C, the method 100 proceeds to an operation 114 by removing the dummy gate stacks 208, resulting in gate trenches 214 in the ILD layer 212. FIG. 6A is a top view; FIG. 6B is a sectional view along the dashed line AA'; and FIG. 6C is a sectional view along the dashed line BB' of the semiconductor structure 200, in portion, constructed in accordance with some embodiments. In some embodiments, the gate stacks 208 are removed by an etching process, such as a wet etch, to selectively remove the gate stacks 208. The etching process may include multiple etching steps to remove the dummy gate if more materials present.

Figure 7A:
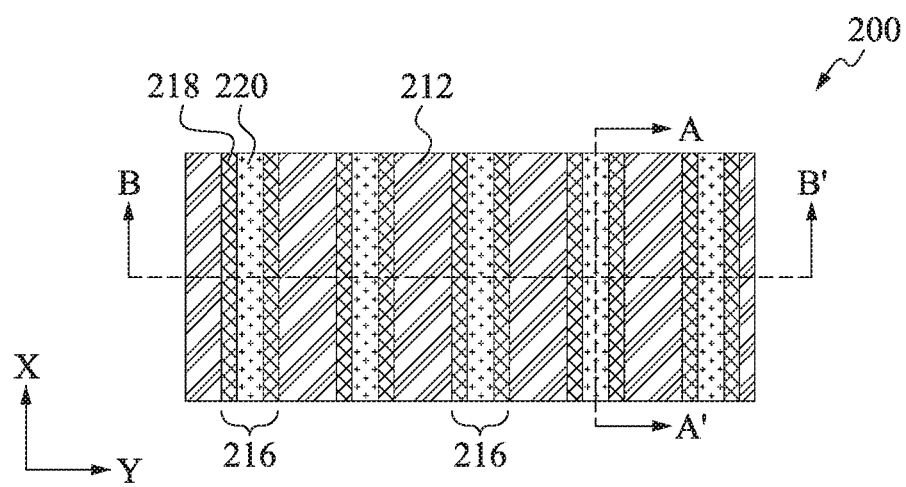
Figure 7B:
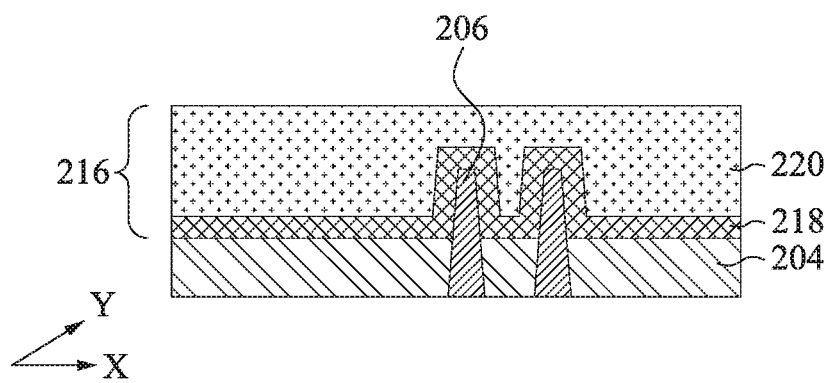
Figure 7C:
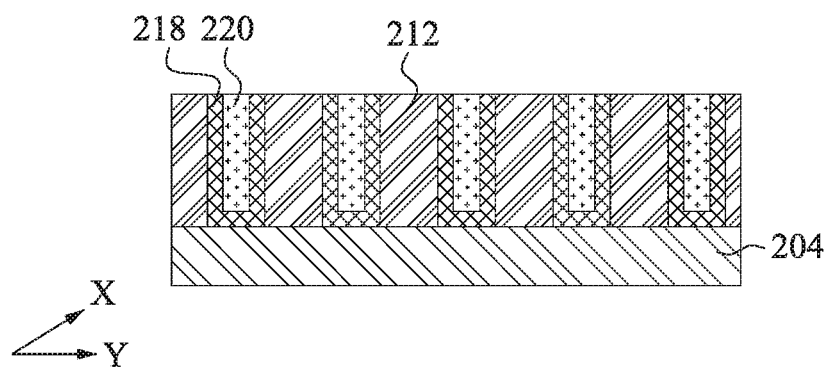

Referring to FIGS. 7A, 7B and 7C, the method 100 proceeds to an operation 116 by forming gate stacks (or gates) 216 in the gate trenches 214. FIG. 7A is a top view; FIG. 7B is a sectional view along the dashed line AA'; and FIG. 7C is a sectional view along the dashed line BB' of the semiconductor structure 200, in portion, constructed in accordance with some embodiments. In the operation 116, the gate stacks 216 are formed with high k dielectric and metal, therefore also referred to as high-K metal gate stacks 216. The gate stacks 216 are formed in the gate trenches 214 by a proper procedure, such as a procedure that includes deposition and CMP. The gate materials, such as high k dielectric material and metal, are deposited in the gate trenches 214; and a CMP process is implemented to polish and remove the excessive gate materials above the top surface of the ILD layer 212.

The gate stacks 216 are formed on the substrate 202 overlying the channel region of the fin active region 206. The gate stacks 216 each include a gate dielectric layer 218 and a gate electrode 220 disposed on the gate dielectric layer 218. In the present embodiment, the gate dielectric layer 218 includes high-k dielectric material and the gate electrode 220 includes metal or metal alloy. In some examples, the gate dielectric layer and the gate electrode each may include a number of sub-layers. The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, or other suitable dielectric materials, such as $Si_3N_4$, oxynitrides (SiON).

In some embodiments, the gate dielectric layer 218 is formed on the bottom surface and sidewalls of each gate trench and is U-shaped. The gate dielectric layer 218 may further includes an interfacial layer sandwiched between the high-k dielectric material layer and the fin active region 206. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques.

The gate electrode 220 may include Ti, Ag, Al, TiAlN, TaC, TaCN, TaSiN, Mn, Zr, TiN, TaN, Ru, Mo, Al, WN, Cu, W, or any suitable conductive material. In some embodiments, different metal materials are used for nFET and pFET devices with respective work functions. The gate electrode 220 may include multiple conductive materials. In some embodiments, the gate electrode 220 includes a capping layer, a first blocking layer, a work function metal layer, a second blocking layer and a filling metal layer. In furtherance of the embodiments, the capping layer includes titanium nitride, tantalum nitride, or other suitable material, formed by a proper deposition technique such as ALD. Each of the first and second blocking layers includes titanium nitride, tantalum nitride, or other suitable material, formed by a proper deposition technique such as ALD. In some examples, the block layers may not present or only one of them presents in the gate electrode. The work functional metal layer includes a conductive layer of metal or metal alloy with proper work function such that the corresponding FET is enhanced for its device performance. The work function (WF) metal layer is different for a pFET and a nFET, respectively referred to as an n-type WF metal and a p-type WF metal. The choice of the WF metal depends on the FET to be formed on the active region. For example, the semiconductor structure 200 includes a first active region for an nFET and a second active region for a pFET, and accordingly, the n-type WF metal and the p-type WF metal are respectively formed in the corresponding gate stacks. Particularly, an n-type WF metal is a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD. In various embodiments, the filling metal layer includes aluminum, tungsten or other suitable metal. The filling metal layer is deposited by a suitable technique, such as PVD or plating.

Thereafter, the gate cut features and dielectric gates are formed on the substrate as described below.

Figure 8A:
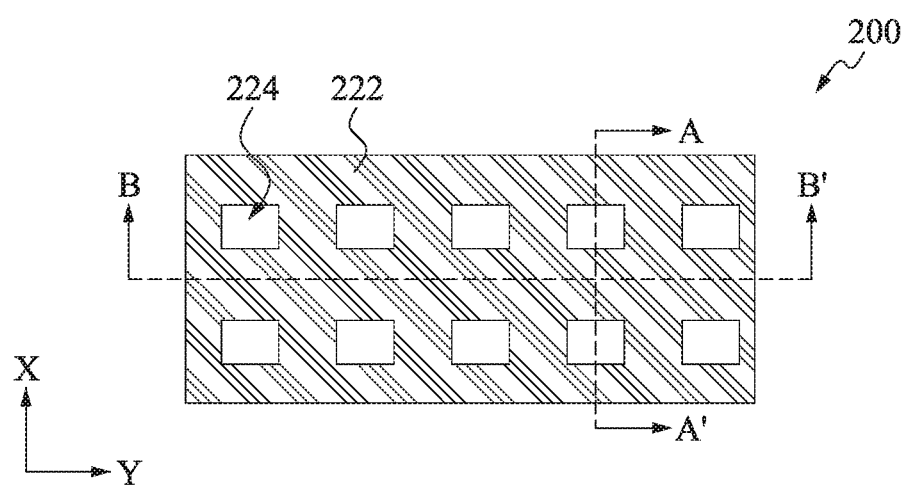
Figure 8B:
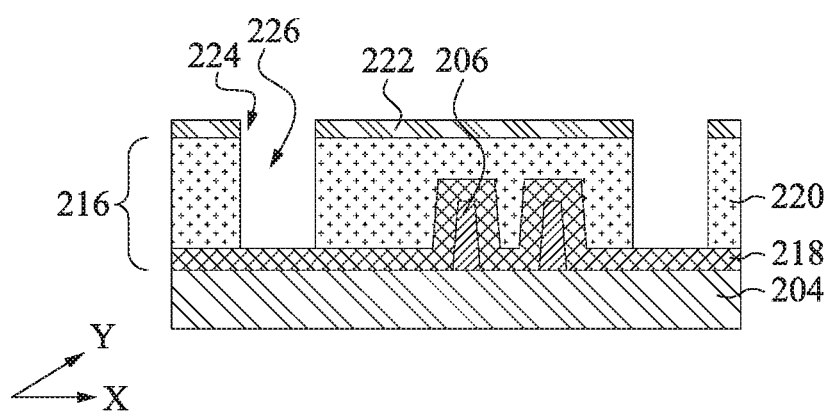
Figure 8C:
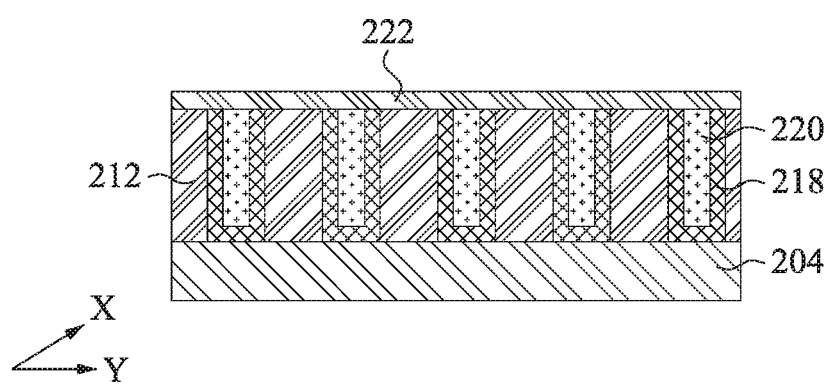

Referring to FIGS. 8A, 8B and 8C, the method 100 proceeds to an operation 118 by performing a gate-cut process to the gate stacks 216. FIG. 8A is a top view; FIG. 8B is a sectional view along the dashed line AA'; and FIG. 8C is a sectional view along the dashed line BB' of the semiconductor structure 200, in portion, constructed in accordance with some embodiments. For fabrication consideration, such as to improve the patterning quality and characteristics of the gate stacks 216, the gate stacks 216 are formed with long geometries and then cut to segments according to the IC design layout. The operation 118 includes patterning the gate stacks 216 by a procedure that includes lithography patterning and etching. In the present embodiment, the operation 118 includes forming a patterned hard mask 222 on the substrate 202 with openings 224 that define the regions of the gate stacks 216 to be cut; and then performing an etching process to the gate stacks 216 through the openings 224 of the hard mask 222 using the hard mask 222 as an etch mask. The operation 118 forms gate-cut openings 226 in the gate stacks 216. The hard mask 222 may use any suitable material, such as silicon oxide, silicon nitride, silicon oxynitride, other suitable dielectric material, or a combination thereof. The hard mask 222 is formed by depositing a hard mask; forming a patterned resist layer by lithography, and etching the hard mask within the openings of the patterned resist layer. The etching process applied to the gate stacks 216 may include multiple etching steps with etchants to respective gate materials, and may include wet etching, dry etching, or a combination thereof.

Figure 9A:
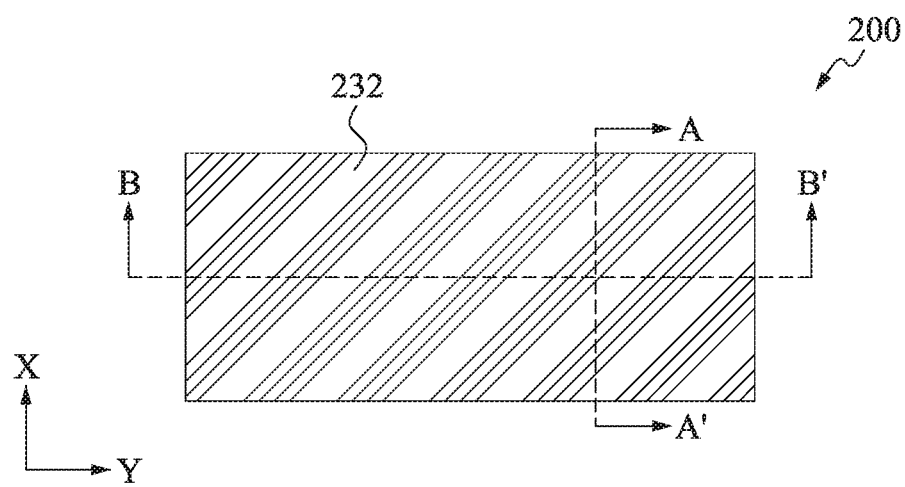
Figure 9B:
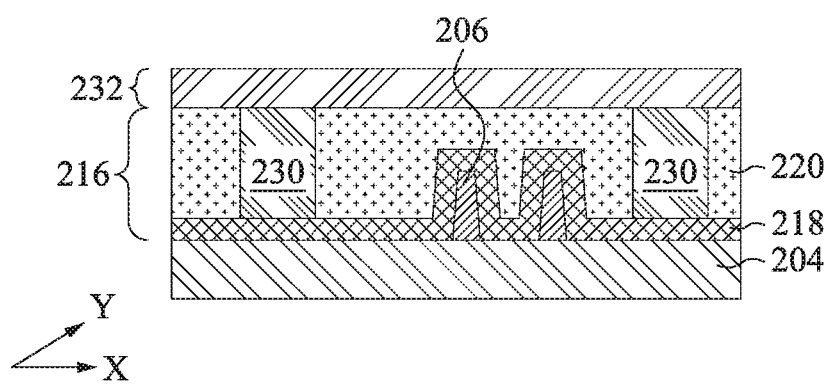
Figure 9C:
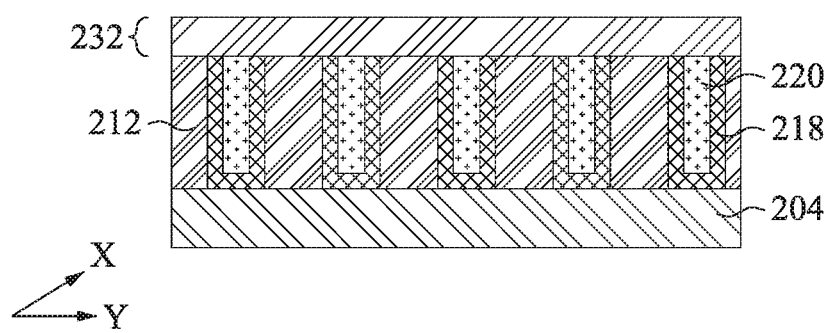

Referring to FIGS. 9A, 9B and 9C, the method 100 proceeds to an operation 120 by filling a dielectric material into the gate-cut openings 226, thereby forming gate-cut dielectric features 230 in the gate-cut openings 226. FIG. 9A is a top view; FIG. 9B is a sectional view along the dashed line AA'; and FIG. 9C is a sectional view along the dashed line BB' of the semiconductor structure 200, in portion, constructed in accordance with some embodiments. In the present embodiment, the formation of the gate-cut features 230 includes deposition and may further include a CMP process after the deposition. The deposition process may deposit any suitable dielectric material using a suitable deposition technique, such as CVD, flowable chemical vapor deposition (FCVD), high density plasma CVD (HDP-CVD), other suitable technique or a combination thereof. After the formation of the gate-cut features 230, the deposited dielectric material may include a top layer 232 remained on the gate stacks 216 and the gate-cut features 230. This top layer 232 can be used as a hard mask for the subsequent process. In alternative embodiments, after the CMP process, the deposited dielectric material is planarized to be coplanar with the gate stacks 216; and then a hard mask 232 is deposited on the top surface of the semiconductor structure 200.

Figure 10A:
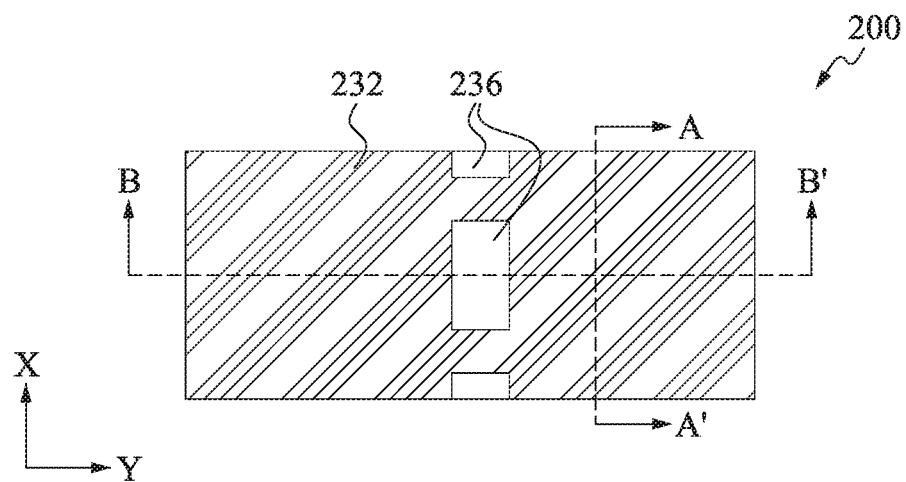
Figure 10B:
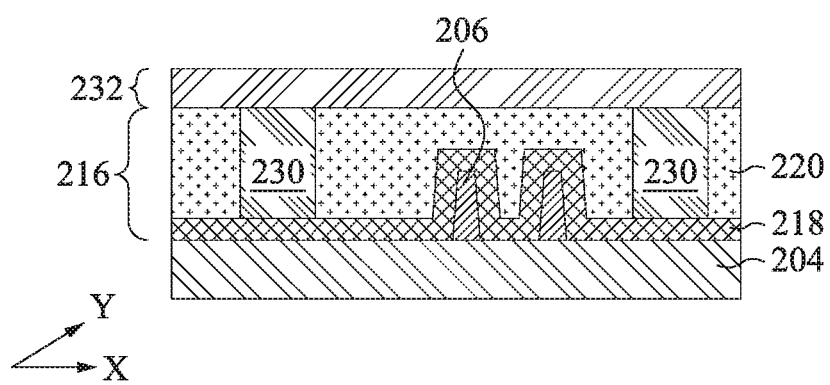
Figure 10C:
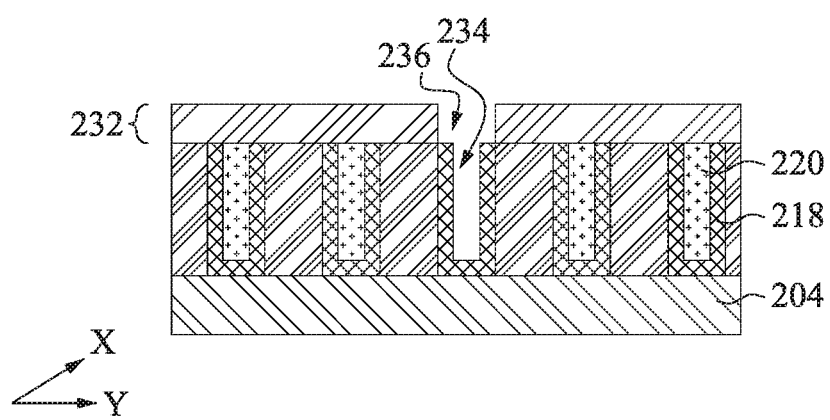

Referring to FIGS. 10A, 10B and 10C, the method 100 proceeds to an operation 122 by removing portions of the gate stacks 216 to form trenches 234. FIG. 10A is a top view; FIG. 10B is a sectional view along the dashed line AA'; and FIG. 10C is a sectional view along the dashed line BB' of the semiconductor structure 200, in portion, constructed in accordance with some embodiments. In the operation 122, the portions of the gate stacks 216 are removed and are to be replaced by dielectric gates. The operation 122 includes patterning the hard mask 232 by lithography process and etching to form a patterned hard mask with openings 236; and etching to remove the portions of the gate stacks 216 within the openings 236, resulting in the trenches 234. In some embodiments illustrated in FIG. 10C, the operation 122 only selectively removes the material(s) of the gate electrode 220 within the openings 236 and the gate dielectric layer 218 remains within the trenches 234 after the operation 122. Thereafter, the hard mask 232 may be removed, such as by etching.

Figure 11A:
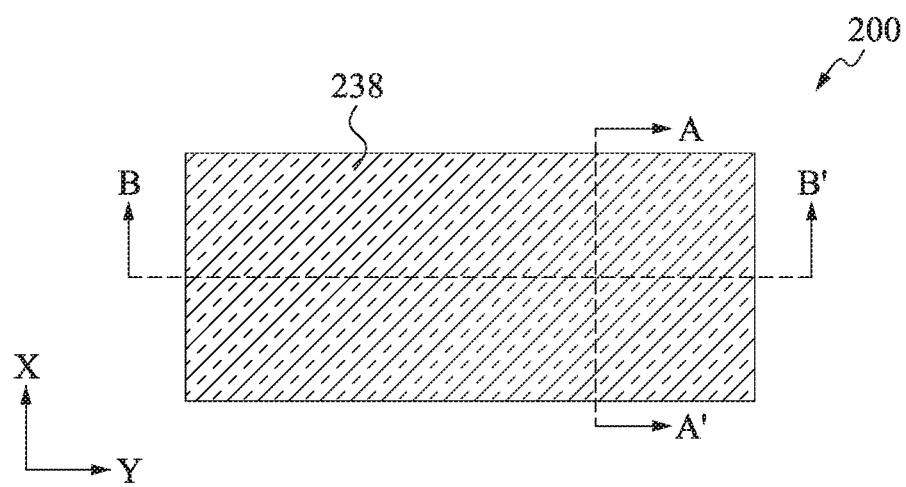
Figure 11B:
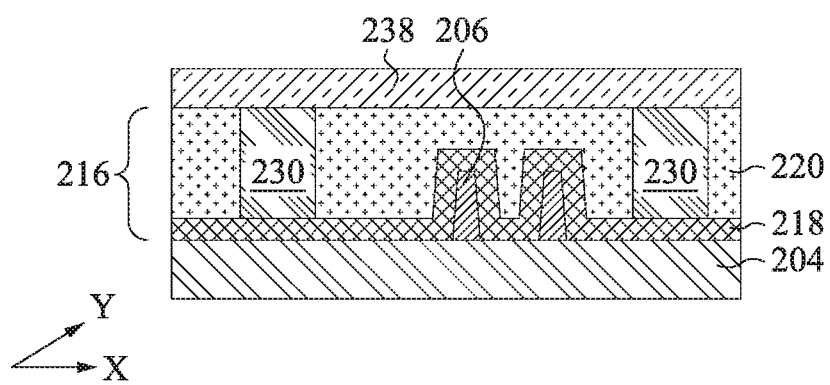
Figure 11C:
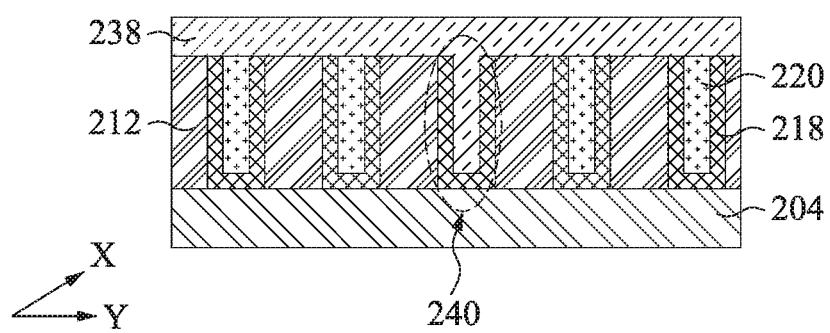

Referring to FIGS. 11A, 11B and 11C, the method 100 proceeds to an operation 124 by filling the trenches 234 with a dielectric material 238 to form dielectric gates 240. FIG. 11A is a top view; FIG. 11B is a sectional view along the dashed line AA'; and FIG. 11C is a sectional view along the dashed line BB' of the semiconductor structure 200, in portion, constructed in accordance with some embodiments. In the operation 124, the dielectric gates 240 are formed to replace the portions of the gate stacks 216. The dielectric gates 240 are dielectric features functioning to provide isolation. The operation 124 includes deposition and may further include a CMP process. The deposition may include any suitable deposition technique, such as CVD, FCVD, HDPCVD, or a combination thereof. The dielectric gates 240 are different from the gate-cut features 230 in composition for various considerations, such as etching selectivity. The gate-cut features 230 and the dielectric gates 240 are both different from the gate dielectric layer 218 in compositions for similar considerations, such as etching selectivity.

As noted above, the gate dielectric layer 218 includes a high-K dielectric material, or alternatively an interfacial layer of silicon oxide and a high-K dielectric material on the interfacial layer. In some embodiments, each of the gate-cut features 230 and the dielectric gates 240 may include silicon oxide, silicon nitride, silicon oxynitride, or a combination thereof but with different composition. For example, the gate-cut features 230 are silicon oxide and the dielectric gates 240 are silicon nitride. The gate-cut features 230 and the dielectric gates 240 may have a multiple layer structure. For example, the gate-cut features 230 include a silicon oxide layer and a silicon nitride layer over the silicon oxide layer while the dielectric gates 240 includes a silicon nitride layer and a silicon oxide layer over the silicon nitride layer.

Figure 14:
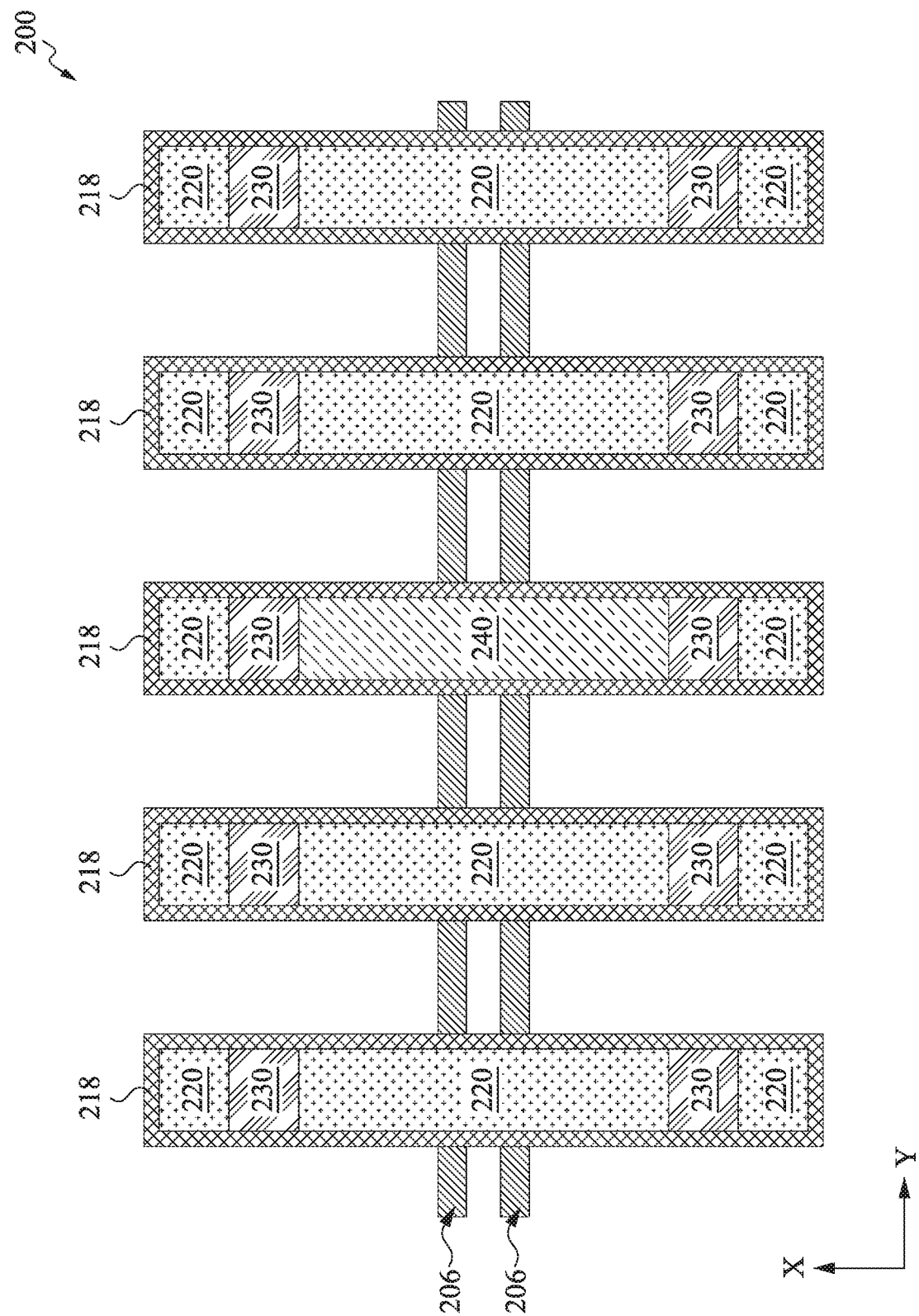
FIG. 14 is a top view of the semiconductor structure constructed according to some embodiments.

Thus formed semiconductor structure 200 has one or more dielectric gates 240 that have the gate dielectric layer 218 on sidewalls as illustrated in FIG. 11C and further illustrated in FIG. 14. FIG. 14 is a top view of the semiconductor structure 200, in portion, constructed in accordance with some embodiments. Only the fin active regions and the gate structure are illustrated. The gate dielectric layer 218 is formed on the sidewalls of the gate electrode 220, and is formed on the sidewalls of the gate-cut features 230 and the sidewalls of the dielectric gates 240 as well. Furthermore, the interface between the gate electrode 220 and the gate-cut feature 230 is free of the gate dielectric layer 218, which leading to increased dimension of the gate electrode 220 and improved device performance. In the present embodiment, the gate electrode 220 in the central location of FIG. 14 is interposed by the gate-cut features 230, which is further interposed by the dielectric gate 240. All are aligned to form a continuous structure that is completely surrounded by the gate dielectric layer 218.

Figure 12A:
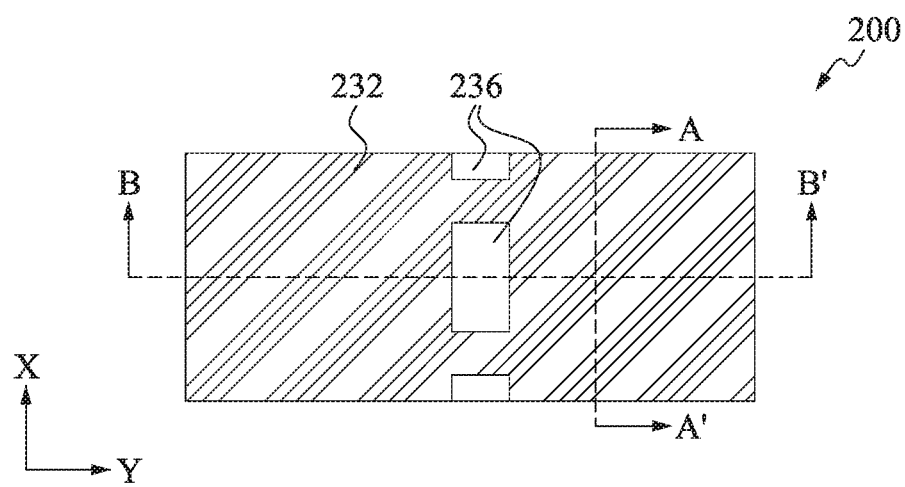
FIGS. 12A and 13A are top views of the semiconductor structure at various fabrication stages constructed according to other embodiments.
Figure 12B:
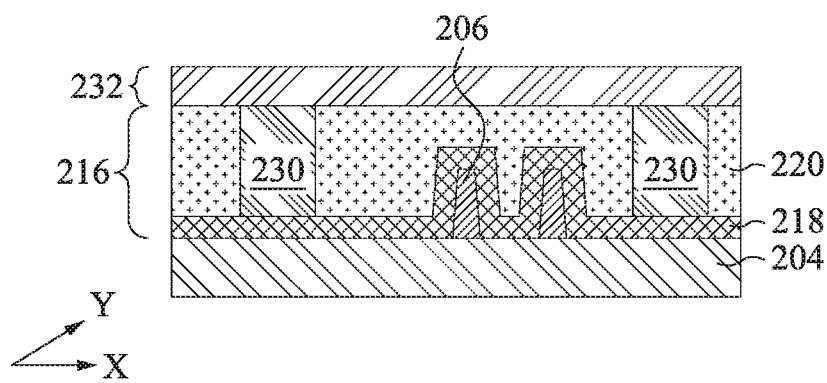
FIGS. 12B and 13B are sectional views of the semiconductor structure along the dashed line AA' at respective fabrication stages constructed according to other embodiments.
Figure 12C:
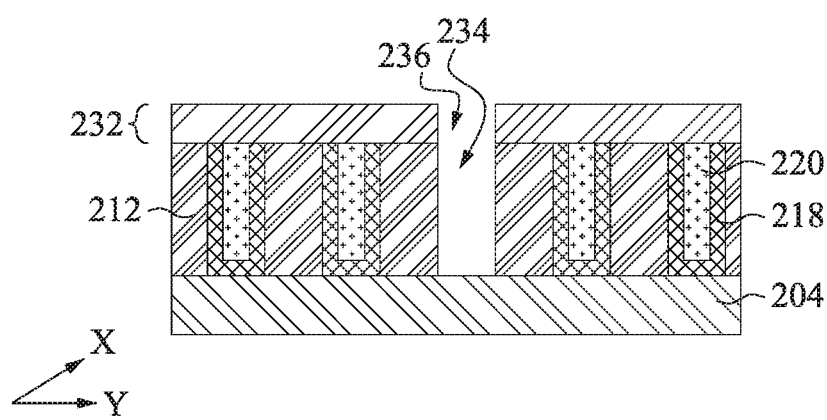
FIGS. 12C and 13C are sectional views of the semiconductor structure along the dashed line BB' at respective fabrication stages constructed according to other embodiments.
Figure 13A:
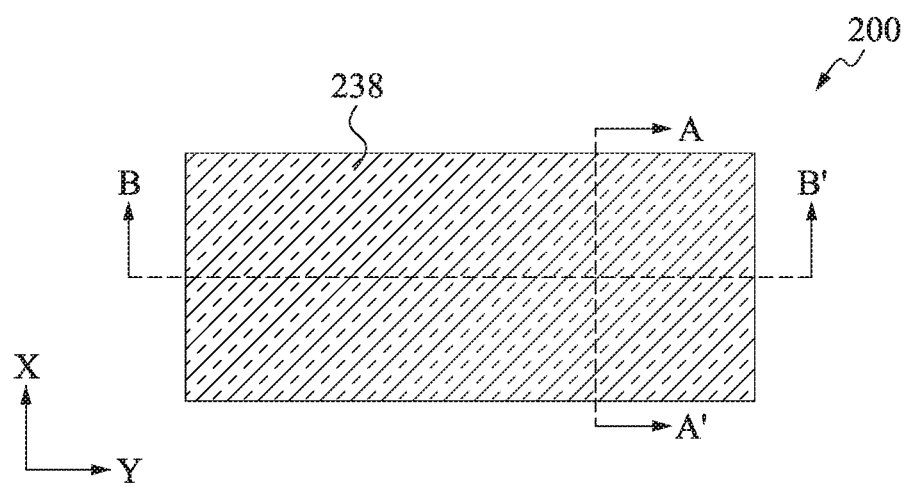
Figure 13B:
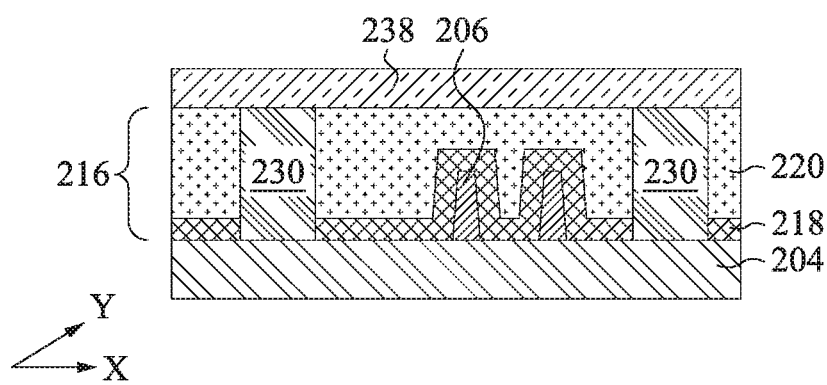
Figure 13C:
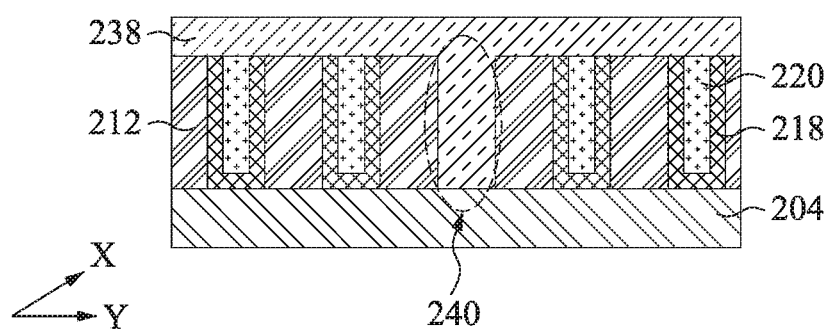

In other embodiments, the operation 122 removes both the gate dielectric layer 218 and the gate electrode 220 within the trenches 234, as illustrated in FIGS. 12A, 12B and 12C. After filling the trenches 234 with a dielectric material 238 by the operation 124, the dielectric gates 240 are formed as illustrated in FIGS. 13A, 13B and 13C. Thus formed dielectric gates 240 have a structure different from that of FIG. 11C. In FIG. 13C, the gate dielectric layer 218 is not present on the outer sidewalls of the dielectric gates 240 and the dielectric gates 240 directly contact the ILD layer 212 from the outer sidewalls.

Figure 15:
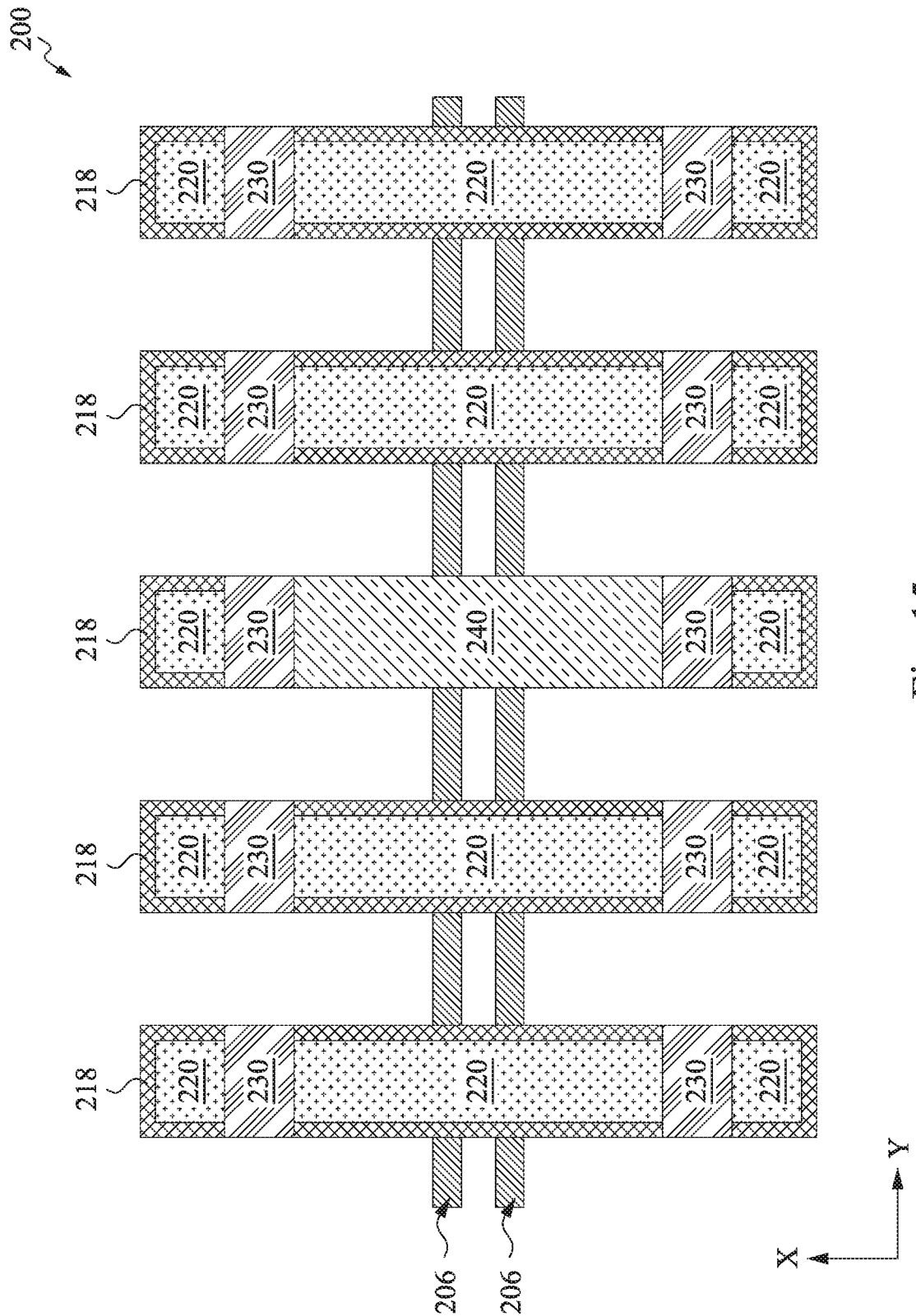
FIG. 15 is a top view of the semiconductor structure constructed according to other embodiments.

Furthermore, if the operation 118 removes both the gate dielectric layer 218 and the gate electrode 220 within the trenches 226, then the gate-cut features 230 are also free of the gate dielectric layer 218 on the outer sidewalls. Thus formed semiconductor structure 200 is further illustrated in FIG. 15. FIG. 15 is a top view of the semiconductor structure 200, in portion, constructed in accordance with some embodiments. Only the fin active regions and the gate structure are illustrated. The gate dielectric layer 218 is formed on the sidewalls of the gate electrode 220 but the dielectric gates 240 and the gate-cut features 230 are free of the gate dielectric layer 218 on respective outer sidewalls. Furthermore, the interface between the gate electrode 220 and the gate-cut feature 230 is free of the gate dielectric layer 218, which leading to increased dimension of the gate electrode 220 and improved device performance. In the present embodiment, the gate electrodes 220 in the central location of FIG. 15 is interposed by the gate-cut features 230, which is further interposed by the dielectric gate 240. All are aligned to form a continuous structure, and the gate electrodes 220 are protected by the gate dielectric layer 218 on respective outer sidewalls. Accordingly, the gate-cut features 230 and the dielectric gates 240 span a greater dimension along the Y direction than that of the gate electrodes 220.

The semiconductor structure 200 and the method 100 making the same are collectively described above in accordance with various embodiments. There are variations and alternatives within the scope of the present disclosure. For example, the formation of the gate-cut features 230 and the dielectric gates 240 may have a different sequence. For example, the dielectric gates 240 are formed and the gate-cut features 230 are formed thereafter. However, both are formed after the formation of the gate stacks 216. In this case, the operations 122 and 124 are implemented before the operations 118 and 120 but after the operations 114 and 116. In another embodiment, the gate-cut features 230 and the dielectric gates 240 are formed simultaneously by a collective procedure, such as one patterning to define both the openings for both the dielectric gates 240 and the gate-cut features 230 with reduced manufacturing cost. Both are further described below.

Figure 16:
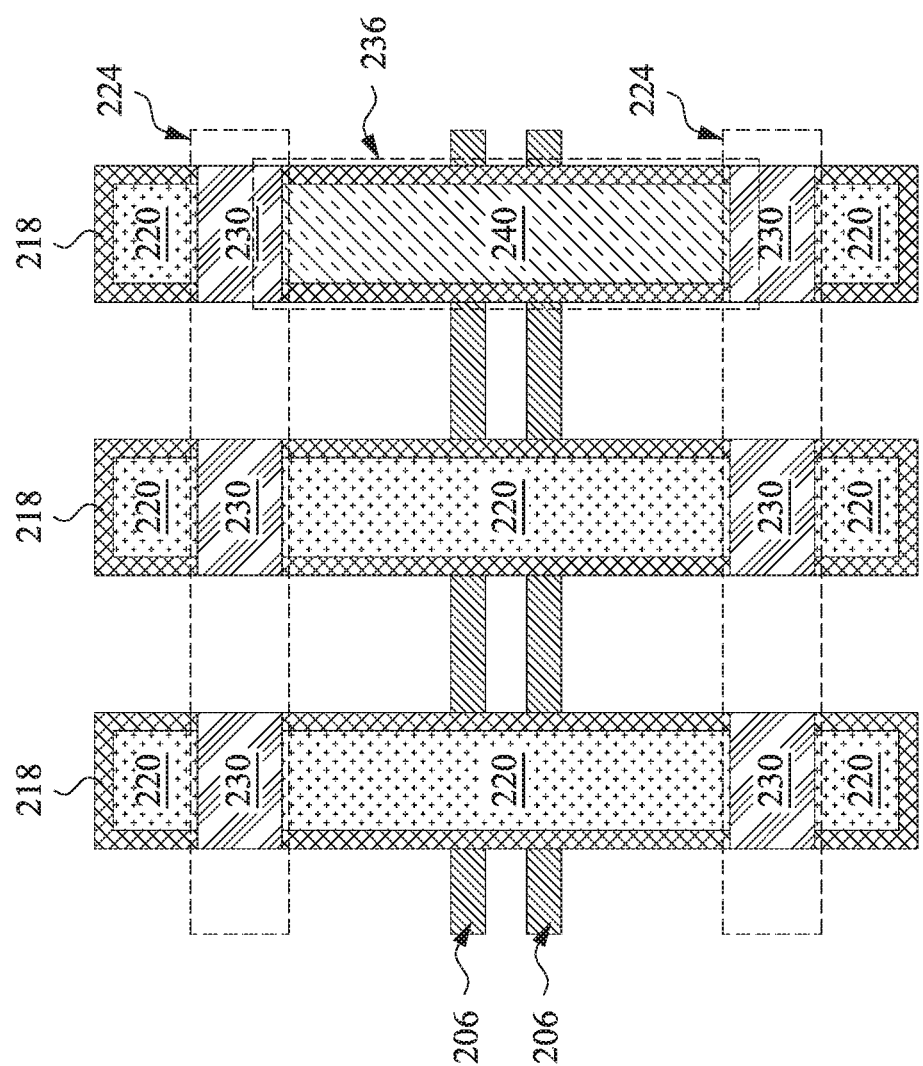
FIG. 16 is a top view of the semiconductor structure constructed according to some embodiments.

In one embodiment illustrated in FIG. 16, the gate-cut features 230 are formed by a first lithography process using a mask pattern with openings 224 (such as the hard mask openings 224 in the operation 118 illustrated in FIG. 8A) and the dielectric gates 240 are formed by a second lithography process using a mask pattern with openings 236 (such as the hard mask openings 236 in the operation 122 illustrated in FIG. 10A).

Figure 17:
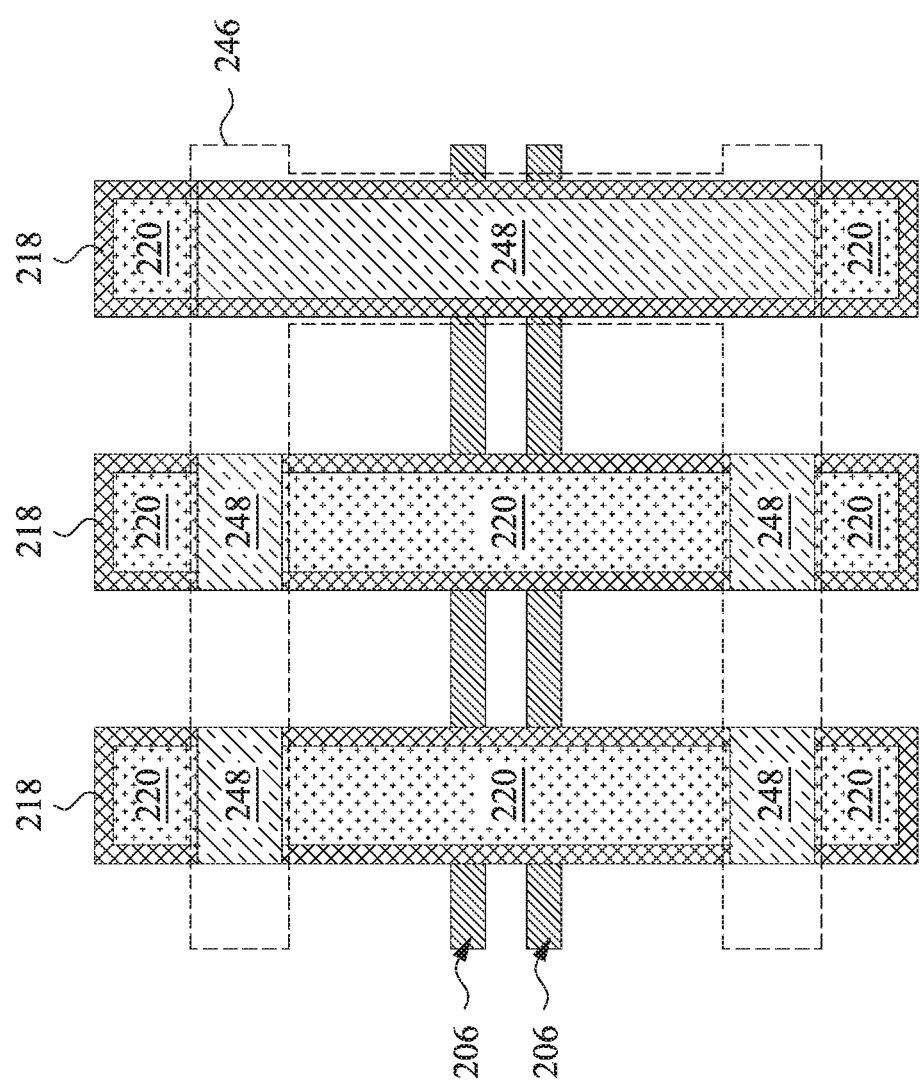
FIG. 17 is a top view of the semiconductor structure constructed according to other embodiments.

In an alternative embodiment illustrated in FIG. 17, the gate-cut features and the dielectric gates are collectively defined by a single mask pattern with openings 246 and are defined by a single lithography process. Thus, the gate-cut features and the dielectric gates are simultaneously formed in a single procedure that includes lithography patterning, etching and deposition. Accordingly, the gate-cut features and the dielectric gates include a same composition and are collectively referred with numeral 248 in FIG. 17.

The present disclosure provides the semiconductor structure 200 and the method 100 making the same in accordance with various embodiments. The method forms the gate-cut features 230 and the dielectric gates 240 after the formation of the high-K metal gate stacks 216. Various advantages may present in various embodiments. By utilizing the disclosed method, the interface between the gate electrode 220 and the gate-cut feature 230 (or the dielectric gate 240) is free of the gate dielectric layer 218, which leading to increased dimension of the gate electrode 220 and improved device performance. The formation of the dielectric gates 240 and the formation of the gate-cut features 230 both are self-aligned processes with better alignment and improved device performance.

Thus, the present disclosure provides a semiconductor structure in accordance with some embodiments. The semiconductor structure includes a fin active region extruded from a semiconductor substrate; and a gate stack disposed on the fin active region. The gate stack includes a gate dielectric layer and a gate electrode disposed on the gate dielectric layer. The gate dielectric layer includes a first dielectric material. The semiconductor structure further includes a dielectric gate of a second dielectric material disposed on the fin active region. The gate dielectric layer extends from a sidewall of the gate electrode to a sidewall of the dielectric gate. The second dielectric material is different from the first dielectric material in composition.

The present disclosure provides a semiconductor structure in accordance with other embodiments. The semiconductor structure includes a fin active region extruded from a semiconductor substrate; a gate stack disposed on the fin active region, wherein the gate stack includes a gate dielectric layer and a gate electrode disposed on the gate dielectric layer; and a dielectric gate of a first dielectric material disposed on the fin active region. The gate dielectric layer includes a second dielectric material being different from the first dielectric material in composition. The gate dielectric layer is disposed on a first sidewall of the gate electrode and is free from a second sidewall of the gate electrode.

The present disclosure also provides a method of forming an integrated circuit structure in accordance with some embodiments. The method includes forming a plurality of fin active regions on a semiconductor substrate; forming a dummy gate stack on the fin active regions; forming an inter-layer dielectric (ILD) layer in gaps between the dummy gate stacks; removing the dummy gate stack to form a first trench in the ILD layer; filling the first trench by depositing a gate dielectric layer of a first dielectric material and depositing a conductive material layer on the gate dielectric layer, thereby forming a high-K metal gate stack; performing a first patterning process to the conductive material layer to form a second trench; filling the second trench with a second dielectric material being different from the first dielectric material in composition; performing a second patterning process to the conductive material layer to form a third trench; and filling the third trench with a third dielectric material being different from the first and second dielectric material in composition.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   a fin active region extruded from a semiconductor substrate;
   a gate stack disposed on the fin active region, wherein the gate stack includes a gate dielectric layer and a gate electrode disposed on the gate dielectric layer, wherein the gate dielectric layer includes a first dielectric material; and a dielectric gate of a second dielectric material disposed on the fin active region, wherein the gate dielectric layer extends from a sidewall of the gate electrode to a sidewall of the dielectric gate, wherein the gate electrode and the dielectric gate are spaced apart from each other such that the gate electrode does not interface with the dielectric gate, and wherein the second dielectric material is different from the first dielectric material in composition.

2. The semiconductor structure of claim 1, further comprising a gate-cut feature of a third dielectric material interposed between the gate electrode and the dielectric gate, wherein the third dielectric material is different from at least one of the first dielectric material and second dielectric material in composition.

3. The semiconductor structure of claim 2, wherein the gate dielectric layer is disposed on a sidewall of the gate-cut feature.

4. The semiconductor structure of claim 2, wherein an interface between the gate electrode and the gate-cut feature is free of the gate dielectric layer.

5. The semiconductor structure of claim 3, wherein the gate-cut feature contacts the gate electrode at a first end and contacts the dielectric gate at a second end being opposite the first end.

6. The semiconductor structure of claim 5, wherein the gate dielectric layer is a continuous feature extending from the sidewall of the gate electrode, through the sidewall of the gate-cut feature, and to the sidewall of the dielectric gate.

7. The semiconductor structure of claim 1, wherein the gate electrode includes metal and the gate dielectric layer includes a high-k dielectric material.

8. A semiconductor structure, comprising:
a fin active region extruded from a semiconductor substrate;
a gate stack disposed on the fin active region, wherein the gate stack includes a gate dielectric layer and a gate electrode disposed on the gate dielectric layer; and
a dielectric gate of a first dielectric material disposed on the fin active region, wherein
the gate dielectric layer includes a second dielectric material being different from the first dielectric material in composition, and
the gate dielectric layer is disposed on a first sidewall of the gate electrode without being disposed on a second sidewall of the gate electrode.

9. The semiconductor structure of claim 8, wherein all sidewalls of the dielectric gate are free of the gate dielectric layer.

10. The semiconductor structure of claim 8, further comprising a gate-cut feature of a third dielectric material interposed between the gate electrode and the dielectric gate, wherein the third dielectric material is different from at least one of the first dielectric material and second dielectric material in composition.

11. The semiconductor structure of claim 10, wherein the gate electrode directly contacts the gate-cut feature.

12. The semiconductor structure of claim 10, wherein the gate dielectric layer includes a high-k dielectric material and the gate electrode includes metal.

13. The semiconductor structure of claim 12, wherein the first dielectric material includes silicon oxide and the third dielectric material includes silicon nitride.

14. The semiconductor structure of claim 8, further comprising a shallow-trench-isolation (STI) feature formed on the semiconductor substrate and contacting the dielectric gate.

15. A semiconductor structure, comprising:
a fin active region extruded from a semiconductor substrate;
a gate stack disposed on the fin active region, wherein the gate stack includes a gate dielectric layer and a gate electrode disposed on the gate dielectric layer, wherein the gate dielectric layer includes a first dielectric material;
a dielectric gate of a second dielectric material disposed on the fin active region; and
a gate-cut feature of a third dielectric material interposed between the gate electrode and the dielectric gate, wherein
the gate dielectric layer continuously extends to cover a first sidewall surface of the gate electrode, a first sidewall surface of the gate-cut feature, and a first sidewall surface of the dielectric gate, and
each of the second and third dielectric materials is different from the first dielectric material in composition.

16. The semiconductor structure of claim 15, wherein the gate-cut feature contacts the gate electrode at a first end and contacts the dielectric gate at a second end being opposite the first end.

17. The semiconductor structure of claim 16, wherein
the gate electrode has a rectangle shape with three sidewall surfaces continuously covered by the gate dielectric layer, and
the gate electrode includes a second sidewall surfaces contacting the gate-cut feature and being free of the gate dielectric layer.

18. The semiconductor structure of claim 17, wherein the dielectric gate is rectangle-shaped and includes a second sidewall surface contacting the gate-cut feature and being free of the gate dielectric layer.

19. The semiconductor structure of claim 15, wherein
the gate electrode includes metal,
the first dielectric material includes a high-k dielectric material,
the second dielectric material includes silicon oxide, and
the third dielectric material includes silicon nitride.

20. The semiconductor structure of claim 15, further comprising a shallow-trench-isolation (STI) feature formed on the semiconductor substrate and contacting the dielectric gate.

* * * * *